United States Patent [19]

Esumi et al.

[11] Patent Number: 4,634,659

[45] Date of Patent: Jan. 6, 1987

[54] PROCESSING-FREE PLANOGRAPHIC PRINTING PLATE

[75] Inventors: Kunio Esumi, Hanyo, Japan; Anthony M. Schwartz, Rockville, Md.; Albert Zettlemoyer, Bethlehem, Pa.

[73] Assignee: Lehigh University, Bethlehem, Pa.

[21] Appl. No.: 683,918

[22] Filed: Dec. 19, 1984

[51] Int. Cl.[4] .......................... G03F 7/10; G03C 1/72; B41N 3/00

[52] U.S. Cl. .................................... 430/302; 101/456; 101/462; 101/465; 430/270

[58] Field of Search ............... 430/270, 302, 297, 190; 101/453, 456, 462, 465

[56] References Cited

U.S. PATENT DOCUMENTS

| 3,615,559 | 10/1971 | Kaspaul et al. | 430/302 |
|---|---|---|---|
| 3,637,384 | 1/1972 | Deutsch et al. | 430/270 |
| 3,759,711 | 9/1973 | Rauner et al. | 430/190 |
| 3,907,564 | 9/1975 | Boardman et al. | 430/270 |
| 3,926,642 | 12/1975 | Breslow et al. | 430/286 |
| 4,115,127 | 9/1978 | Ikeda et al. | 430/270 |
| 4,139,384 | 2/1979 | Iwasaki et al. | 430/190 |
| 4,247,611 | 1/1981 | Sander et al. | 430/270 |
| 4,306,011 | 12/1981 | Uehara et al. | 430/190 |

OTHER PUBLICATIONS

Fox et al., "Wettability . . . Polymers", *Advanced Chemical Series*, 87, 11/1968, pp. 72–85.

Primary Examiner—Richard L. Schilling
Attorney, Agent, or Firm—Ratner & Prestia

[57] ABSTRACT

Method of making a processing-free planographic printing plate comprising irradiating a plate surface comprised of a hydrophobic organic compound capable of being converted, upon exposure to radiation, from hydrophobic to hydrophilic, in an image pattern and thereby selectively converting said surface, in the image pattern, from hydrophobic to hydrophilic. Alternatively, the image pattern is allowed to remain hydrophobic while the non-image areas are rendered hydrophilic.

3 Claims, 2 Drawing Figures

PROCESSING-FREE PLANOGRAPHIC PRINTING PLATE

BACKGROUND OF THE INVENTION

The present invention relates to a processing-free planographic printing plate, i.e., a planographic printing plate which, after exposure, is ready for use without further processing.

Deep-etch plates and presensitized plates, as planographic printing plates, have enjoyed popularity.

Deep-etch plates are prepared by applying a light-sensitive coating to a grained aluminum or zinc plate. Upon exposure to a patterned image, the resin is hardened by exposure. The plate is then etched, removing the light-sensitive resin layer hardened by exposure. On the other hand, presensitized plates are obtained by coating a light-sensitive resin on an aluminum plate. After development, a developing ink or a protective lacquer is applied to the hardened light-sensitive resin layer which becomes the image areas. For both printing plates, a developing step is required.

The manufacture of such plates typically involves coating a metal plate with a light-sensitive resin, exposing the resin to a patterned light image and processing to selectively remove resin in the patterned shape produced by the light image.

It is this processing or etching step which is avoided in the making of processing-free planographic printing plates. Such plates, upon exposure and mounting on a printing press are immediately ready for use without any chemical processing.

"Processing-free" printing plates are disclosed, for example, in U.S. Pat. Nos. 3,650,743 and 4,115,127. These plates utilize three and two layered structures, respectively. The former includes arsenic, and the latter requires coating, by vacuum disposition, of mixed inorganic materials. Thus, both have practical disadvantages.

The general object of the present invention is to provide a practical, single layer, processing-free planographic printing plate.

A 1968 publication by R. B. Fox et al of the Naval Research Laboratory, entitled "Wettability and Constitution of Photooxidized Polystyrene And Other Amorphous Polymers" (*Advanced Chemical Series*, 87, 72) has reported the effect of ultraviolet (UV) irradiation in air on the wettability of thin films of amorphous polymers. Based on the polymers studied and reported upon by Fox et al, it was concluded that changes in contact angles (as an indication of wettability) for various liquids, both polar and non-polar, are a function of the nature of the polymers studied. The result obtained for the contact angle assay has been correlated with the wettability of a polymeric surface by liquids of known surface tensions. The Fox et al article details the protocol that was employed here in evaluating changes in hydrophobicity/hydrophilicity of the materials used in this invention.

SUMMARY OF THE INVENTION

In the present invention, planographic printing plates are made by selectively exposing a base plate, coated with a photooxidation-sensitive resin, to a patterned image of electromagnetic (preferably UV range) radiation. The hydrophilic and printing ink-receptive quality of the radiation exposed portions of the plates is altered by the radiation and thus, following exposure, the exposed portion is quite different in ink receptiveness (newly hydrophilic) as compared to the unexposed portions thereof. In one embodiment the invention is used to provide plates in which the image areas reject the ink while the background areas accept it. In an alternative embodiment, the invention is used to provide plates in which the imaged areas accept the ink.

DETAILED DESCRIPTION OF THE INVENTION

Figure 1:
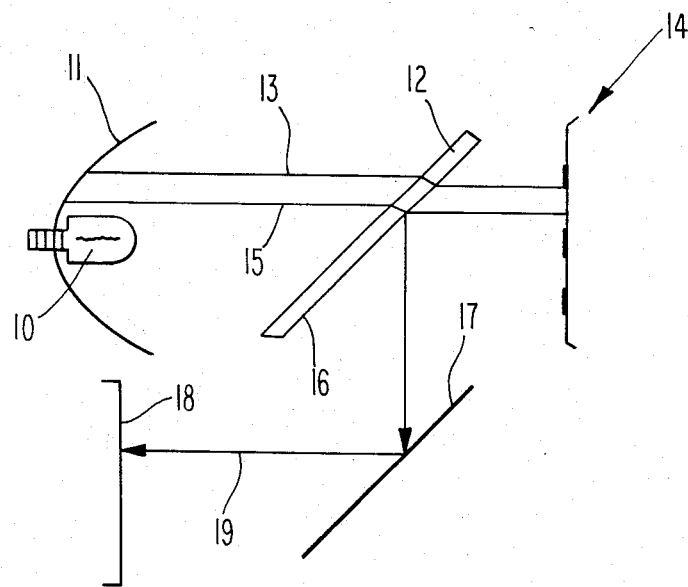
FIGS. 1 and 2 are diagrammatic illustrations of two imaging systems useful in the present invention.

The base or substrate of the plate of the present invention is a member having suitable rigidity and suitable adhesiveness for the photooxidation-sensitive resin that is to be superposed on it. This includes all of those plates which have heretofore been used as base plates for conventional lithographic printing plates, or which have the possibility to be used as such a base plate. This includes specifically metal plates, or plates formed of a synthetic resin sheet whose surface can be adhesively bonded to the photooxidation-sensitive resin. Some of the suitable photooxidation-resins, when formed into sheets of appropriate thickness are inherently stiff enough and hard enough to serve as their own base plates. Other possibilities include a laminate of a metal plate or metal foil and a synthetic resin sheet or paper.

Typically, base plates are comprised of aluminum or zinc. However, so-called multi-layer plates may also be used. These include a bimetal plate, comprising an aluminum plate having a copper or chromium layer, or comprising a copper plate having a chromium layer, a trimetal plate comprising a steel plate having a copper layer and a chromium layer, an aluminum clad plate comprising an aluminum alloy plate having a pure aluminum layer, or a laminate of a plastic sheet or paper and an aluminum foil. Moreover, modified forms of these metal plates, modified by the process known as graining, for example, may also be used.

In making the printing plate of this invention, the base member or substrate, described above, is coated with a composition which is hydrophobic, but which is also capable of being converted or rendered hydrophilic, upon exposure to a source of radiation, usually by photooxidation at the surface of the coating material.

Suitable coating compositions for this purpose include polystyrene, polymethylvinyl ketone, cellulose triacetate, polydiphenyl siloxane, polyvinyl chloride, silane compounds such as (alpha-methylphenyl) trichlorosilane, polyacrolein, polyethylene, poly-(styrene and allyl alcohol), certain polymers of the polyamide and polyester classes, and polyacetal resin. Silicone-based polymers may also be used. Such compounds include homopolymers and copolymers of methylhydrosiloxane, and copolymers of dimethylsiloxane with functionally substituted alkylsiloxanes.

The thickness of coating required may vary depending on the nature of the coating composition. However, the thickness of the coating generally should be sufficient to ensure that the hydrophilic-hydrophobic nature of the coating alone will govern the ink-receiving and ink-releasing characteristic of the coated plate.

As indicated above, the coating composition must be capable of undergoing photooxidation at its surface, induced upon exposure to radiation, such as ultraviolet radiation. In one method of making a printing plate in accordance with the present invention, the coated plate member is exposed to a radiation source, such as an ultraviolet radiation source, through a mask (stencil), patterned in accordance with the desired image or typed material to be printed. The passage of radiation through the openings in the mask to exposed areas of the coated plate renders the exposed areas hydrophilic while the unexposed areasss remain unchanged, i.e., hydrophobic.

No further processing or development of the coated plate member is required to effect this differential hydrophobic-hydrophilic characteristic.

As used when mounted on a printing press, this planographic plate is first washed with an aqueous fountain solution, which is received by the hydrophilic (exposed) areas of the printing plate. Then a standard oleophilic printing ink is applied to the printing plate. The ink adheres only to the unwetted (unexposed to UV) areas to form an ink pattern for subsequent printing. The resulting print from the plate is a negative of the original artwork, and a positive of the stencil. We, therefore, refer herein to this type of plate as a negative-working, planographic plate. A plate that provides a print which is a positive of the original artwork is herein referred to as a positive-working plate.

"Negative-working" plates are less useful commercially than "positive-working" plates.

We have now devised an economical process for converting hydrophobic polymer surfaces into positive-working lithographic plates, in accordance with the present invention. In this process, the original artwork (the image of which is to be reproduced repeatedly by the printing plate) is drawn in non-reflective ink on a reflective background. The terms "reflective" and "non-reflective" refer to reflectivity for ultraviolet radiation in the wavelength range 250-350 nm.

As an example, the artwork to be copied can consist of ordinary black ink typing or drawing on a white paper background. Optimally, the ink should be strongly absorbing (non-reflective) of the radiation and the lighter background strongly and specularly reflective. For example, the artwork can be drawn in black ink on a smooth, polished metal sheet.

A real ultraviolet image of the artwork is now projected onto a screen (plate) that is composed of or surfaces with the hydrophobic polymer. Since this is a "real" image in the optical sense, those portions of the polymer under the dark (unilluminated) areas will remain hydrophobic, while the ultraviolet-lighted (illuminated) areas will become hydrophilic. After sufficient exposure, the screen without further processing can be used as a positive-working lithographic printing plate.

Any of the optical devices known under the names "diascope" or "opague projector" can be used to throw an image of the artwork onto the ultraviolet-sensitive hydrophobic polymer surface. In such a device, the projection lamp or illuminator must emit strongly in the ultravoilet range of 250-300 nm. A satisfactory illuminator is a mercury arc lamp emitting strongly at 254 nm. The reflecting surfaces in this device should be highly reflective in the sense described above, and are preferably made of smoothly polished metal so as to be specularly reflective. The lenses in this device must be transparent to and refractive of UV light of 250-300 nm wavelength. These lenses are advantageously made of fused quartz.

Another suitable device for selectively projecting a UV light beam from an artwork to be copied, onto a hydrophobic polymer surface, is shown in FIG. 1.

This device, as schematically illustrated in FIG. 1, comprises a mercury arc lamp 10, some of the omnidirectional light rays of which impinge on a parabolic reflector 11 and are thereby reflected to form a parallel collimated beam. The collimated UV beam passes through a transparent lens 12, typically of fused quartz, in a first path 13, impinging on the artwork 14, in particular, on the non-reflecting portions of the work, with that part of the beam being absorbed. A parallel UV beam 15 also transits the quartz 12, but impinges on a reflective part of work 14, thus being reflected back to the transparent mirror surface 16 which is provided on the face of quartz 12 opposite the artwork.

The surface 16 deflects the reflected light to a conventional mirror 17, and from there to the suitably positioned hydrophobic polymer surface of planographic plate 18 along path 19. With sufficient time exposure, plate 18 becomes imaged with a hydrophobic-hydrophilic pattern indentification, conforming to the UV-light reflective (and non-reflective) facade of artwork 14.

The sensitized plate 18 is now minimally handled, in the manner described above, to provide a planographic printing plate, defined as a "positive-working" plate; in other words, one in which the image areas accept the oleophilic printing ink, while the background areas accept only the aqueous fountain solution.

Figure 2:
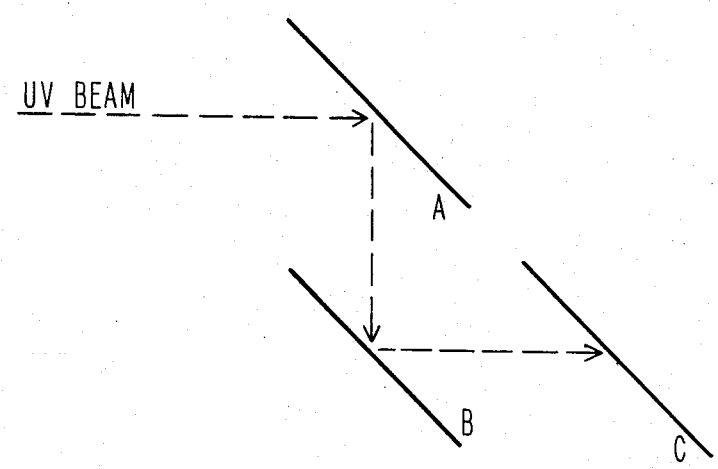

The opaque projector as well as the one way mirror device described above and shown in FIG. 1 are adapted to black or other non-reflective artwork done on an ordinary white background such as paper. A simpler method for imaging the UV-sensitive plate is shown in FIG. 2. In this method, the artwork is drawn in ordinary non-reflective ink, or other marking material that does not reflect UV light, onto a flat specularly reflective mirror surface shown as A in FIG. 2. The image is reflected from A onto the mirror B which further reflects a correctly oriented image onto the sensitized plate C. The reversing mirror B can optionally be eliminated, and C placed where B is in FIG. 2. In that situation, however, the development image on C will be a mirror image of the artwork on A.

The printing plates produced in accordance with the present invention will vary in durability depending on the wear resistance of the specific photooxidation-sensitive resin used in its preparation. The degree of durability can be selected and balanced against other practical factors, such as costs, by using the appropriate resin.

Following are several specific examples of the present invention (Examples 1, 12-14 and 16) and examples of several screening tests (Examples 2-11 and 15) to determine the suitability of certain polymeric resins for use in the present invention by the conversion (or absence thereof) of a coated base member from hydrophobic to hydrophilic. Unless otherwise indicated, all parts, percents, ratios, and the like, are by weight.

EXAMPLE 1

Commercially available polystyrene (supplied by Dajac Labs, Inc.) was homogeneously dispersed in methylene chloride solvent and further diluted to form a 2 wt% solution. This solution was uniformly coated, to a thickness of 0.5 to 1.0 mm. on a grained, 100 by 100 mm. aluminum plate. The polymeric deposition was then air-dried to form an adhering, hydrophobic layer on one face of the aluminum plate.

The resulting photooxidation-sensitive laminate was exposed through a patterned stencil for 50 min. For the above polystyrene example, with this lamp at 5 cm., 50 min. was necessary, using as the UV ray-producing apparatus a 55.2 watt, low pressure mercury lamp, manufactured by the Oriel Company. The gap between the lamp and the sample was 5 cm. After exposure, the plate, without further treatment, was mounted in a laboratory scale planographic proofing press. Using conventional fountain solution and oleophilic lithographic inks, satisfactory prints of the stencil pattern were obtained on paper and other substrates.

In order to evaluate other coating compounds and polymers for use in the present invention, the hydrophobic/hydrophilic characteristics of these materials, both before and after exposure to UV radiation, was measured by measurement of the contact angle of a drop of water in the manner of Fox et al. Changes in these characteristics over time (as in storage) or upon exposure to or extraction with water (simulating the fountain solution) were also studied. Contact angle measurements were made on a commercial contact angle goniometer. Three drops of each given liquid were measured, on both sides thereof, and the six values were averaged. Overall variation in the measurement was about ±3°. The material under test was coated onto an aluminum plate in each case.

Commercially available forms of these materials were coated to a thickness sufficient to cover all rugosities in the base plate. This thickness is usually at least 5 microns. There are no upper limits on the thickness except as may be dictated by mechanical considerations. Irradiation was carried out as in Example 1 for the times indicated in the Examples 2-11 which follow.

EXAMPLE 2

Polystyrene

The initial contact angle of water was about 83°. The contact angle decreased gradually until 30 minute exposure time and then rapidly decreased, reaching about 30° in a 60 minute exposure time. Water extraction brought the water contact angle up to about 55°-60° range.

EXAMPLE 3

Polymethylvinylketone

The contact angle of water was about 70° initially and approached 20° with a 60 minute exposure time. Water extraction brought the water contact angle up to about 40°.

EXAMPLE 4

Poly(styrene co-allyl alcohol) 5.7% hydroxyl

The initial contact angle of water was about 82°. Irradiation of 80 minutes brought the contact angle to about 20°. This contact angle did not increase on dark storage but rose to 50° on water extraction.

EXAMPLE 5

Polyethylene

The initial contact angle of water was over 100°. Irradiation of 50 minutes brought the contact angle to 55°. This contact angle did not change during dark storage for 48 hours.

EXAMPLE 6

Polyvinylchloride

This material gained hydrophilicity rather slowly and to a limited extent when irradiated. The initial contact angle of water was about 82° and reached about 50° in a 90 minute exposure time. On storage, the water contact angle came back to about 60° in one day. Water extraction had very little effect on the water contact angle after 90 minute exposure time.

EXAMPLE 7

Polydiphenylsiloxane

The contact angle of water was about 82° initially and reached 20° in 40 minutes exposure time.

EXAMPLE 8

Cellulose triacetate

The initial water contact angle of this material was 60°. Irradiation gave a curve of contact angle vs. irradiation that showed a break at about 60 minutes and 45°. At 60 minutes, the contact angle dropped to about 27°. Upon dark storage, this angle did not increase. Water extraction raised the contact angle slightly, on a 100 minute exposed sample, to about 30°, but raised the contact angle to 45° on a 120 minute exposed sample.

EXAMPLE 9

Polyacetal resin

The initial water contact angle was about 70° and decreased gradually, reaching 40° in 60 minute exposure time.

EXAMPLE 10

Polyacrolein

The initial water contact angle of this material was about 55°. The contact angle reached about 30° in about 30 minute exposure time.

EXAMPLE 11

Polymethylhydrosiloxane

The water contact angle was about 90° initially and reached about 50° in a 40 minute exposure time. On storage the contact angle remained stable.

EXAMPLE 12

A plate was made by depositing polydiphenyl siloxane onto aluminum, as in Example 7. Deposition was made from a 2% solution of the polymer in methylene chloride. Air drying formed an adherent hydrophobic layer. The photooxidation-sensitive layer was exposed to UV irradiation through a stencil, as in Example 1, for 30 minutes. The resulting printing plate was used in the same press used in Example 1. Satisfactory prints were obtained.

EXAMPLE 13

Similarly, two other polyalkylsiloxane polymers, polymethylhydrosiloxane and polymethylhydromethylcyanopropylsiloxane, both supplied by Petrarch Systems, Inc. of Levittown, Pa. were coated (both from methylene chloride solvent) onto aluminum plates and rendered selectively hydrophilic by the above procedure to produce a useful planographic printing plate.

EXAMPLE 14

Still other similar results were obtained in plates with aluminum as the substrate and two other polymeric materials, poly(vinylchloride) and polyacrolein, each deposited from 2 wt% solutions of tetrahydrofuran and dimethylsulfoxide, respectively. These were converted by selective UV irradiation to patterned hydrophilic surfaces, as described in Example 1, and tested as printing plates.

Certain polymers, notably some members of the polyamide and polyester series, are particularly useful because their mechanical properties allow them to be used in film form without need for a supporting substrate such as aluminum sheet. Following are two examples of such polymers.

EXAMPLE 15

A self-supporting sheet of dense paper made entirely of Nomex Type 420 aramide polymer, a polyamide, was exposed to ultraviolet radiation as in Examples 2–11. The water contact angle of the unexposed sheet was 65°. After 60 minutes the exposed portion had become hydrophilic, and had a contact angle of 37°.

EXAMPLE 16

A self-supporting film of polyethylene terephthalate was exposed through a stencil as in Examples 1 and 12. The exposure time was 50 minutes during which time the water contact angle of the exposed portion went from 57° to 16°. This film, used as the plate on a planographic proofing press, gave a good print of the stencil pattern.

While this invention has been described with reference to specific embodiments thereof, it is not limited thereto, and the appended claims are intended to be construed to encompass the present invention in all of its forms and embodiments as may be devised by those skilled in the art.

We claim:

1. A method for making a planographic printing plate by means of a photosensitive element comprising two discrete layers substantially adhering to one another, the first of said layers consisting essentially of a support that has suitable rigidity, the second of said layers comprising a polymeric compound having a photo oxidation sensitive hydrophobic surface, and compound being selected from among the group consisting of polystyrene, polymethylvinyl ketone, cellulose triacetate, polydiphenylsiloxane, polyvinyl chloride, (alpha-methylphenyl) trichlorosilane, polyacrolein, polyethylene, poly (styrene co-allyl alcohol), polyacetal resin, polyester, polyamide, polymethylhydrosiloxane, and polymethylhydro (40–60%) methylcyanopropylsiloxane, said compound being receptive to oleophilic printing ink and non-receptive to the aqueous fountain solution of a printing press, said polymeric compound also being directly convertible, upon exposure to radiation to a hydrophilic surface, said method comprising impinging radiation in a defined image upon the surface of the second polymeric layer for causing, selectively and discretely, the formation of hydrophilic areas on said second layer, the areas not having been impinged upon by the radiation remaining hydrophobic, said hydrophilic areas, without further processing, being selectively receptive to the aqueous fountain solution of a printing press.

2. A method for making a planographic printing plate comprising irradiating, in a defined image pattern, a plate surface comprised of a photo oxidation sensitive polymeric material selected from among the group consisting of polystyrene, polymethylvinyl ketone, cellulose triacetate, polydiphenylsiloxane, polyvinyl chloride, (alpha-methylphenyl) trichlorosilane, polyacrolein, polyethylene, poly (styrene co-allyl alcohol), polyacetal resin, polyester, polyamide, polymethylhydrosiloxane, and polymethylhydro (40–60%) methylcyanopropylsiloxane which material is hydrophobic and directly convertible upon irradiation to be hydrophilic, under conditions sufficient to selectively convert the irradiated portion of said surface from hydrophobic to hydrophilic, the resultant hydrogphilic areas being selectively receptive to the aqueous fountain solution of a printing press.

3. A method for making a planographic printing plate, as recited in claim 2, wherein said resulting plate is a positive working plate said method comprising illuminating with ultraviolet light only those areas of the photosensitive surface that are not to be imaged while avoiding illumination of a defined image area, said effect being accomplished by projecting a real image in the desired pattern onto the photsensitive surface, using any of the conventional means for projecting a real optical image by reflection.

* * * * *